United States Patent
Jiang

(10) Patent No.: US 10,860,152 B2
(45) Date of Patent: Dec. 8, 2020

(54) CAPACITANCE DETECTION CIRCUIT, TOUCH APPARATUS AND TERMINAL DEVICE

(71) Applicant: SHENZHEN GOODIX TECHNOLOGY CO., LTD., Shenzhen (CN)

(72) Inventor: Hong Jiang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/553,178

(22) Filed: Aug. 28, 2019

(65) Prior Publication Data

US 2019/0391704 A1 Dec. 26, 2019

Related U.S. Application Data

(63) Continuation of application No. PCT/CN2018/092215, filed on Jun. 21, 2018.

(51) Int. Cl.
*G06F 3/044* (2006.01)
(52) U.S. Cl.
CPC .................. *G06F 3/0444* (2019.05)
(58) Field of Classification Search
CPC ..... G06F 3/0412; G06F 3/0416; G06F 3/0444
USPC .................................................. 345/173, 174
See application file for complete search history.

(56) References Cited

U.S. PATENT DOCUMENTS

| 5,861,583 | A | 1/1999 | Schediwy et al. |
| 8,378,954 | B2 | 2/2013 | Brown |
| 8,525,811 | B2* | 9/2013 | Lee .................. G06F 3/044 345/174 |
| 9,261,545 | B2 | 2/2016 | Iwamoto et al. |
| 9,685,874 | B2* | 6/2017 | Chen ................. H02M 3/33507 |
| 9,853,655 | B1 | 12/2017 | Pernull et al. |
| 2011/0273193 | A1 | 11/2011 | Huang et al. |
| 2013/0241630 | A1 | 9/2013 | Klein et al. |
| 2015/0028895 | A1 | 1/2015 | Tseng et al. |
| 2015/0042363 | A1 | 2/2015 | Han |

(Continued)

FOREIGN PATENT DOCUMENTS

| CN | 103109196 A | 5/2013 |
| CN | 203084695 U | 7/2013 |

(Continued)

*Primary Examiner* — Calvin C Ma

(57) ABSTRACT

A capacitance detection circuit, a touch apparatus, and a terminal device are provided. The capacitance detection circuit includes: a charging circuit, configured to charge a detection capacitor, so that a voltage difference value between two polar plates of the detection capacitor is a first preset voltage value; a discharging circuit, configured to cause the charged detection capacitor to release a first quantity of charges where the first charge quantity is smaller than a charge quantity corresponding to the first preset voltage value; and a signal detection circuit, configured to detect a voltage difference value between a voltage value on the detection capacitor after being discharged by the discharging circuit and a second preset voltage value to determine a capacitance change of the detection capacitor based on the voltage difference value. The capacitance detection circuit is capable of performing capacitance detection when the self-capacitance is large.

18 Claims, 4 Drawing Sheets

(56) References Cited

U.S. PATENT DOCUMENTS

| | | | |
|---|---|---|---|
| 2015/0179122 A1* | 6/2015 | Brown | G06F 3/0488 345/174 |
| 2017/0102826 A1* | 4/2017 | Hamaguchi | G06F 3/03545 |
| 2018/0204036 A1* | 7/2018 | Akhavan Fomani | G06K 9/0002 |

FOREIGN PATENT DOCUMENTS

| | | |
|---|---|---|
| CN | 107690584 A | 2/2018 |
| CN | 107820570 A | 3/2018 |
| JP | 2009042903 A | 2/2009 |

\* cited by examiner

CAPACITANCE DETECTION CIRCUIT, TOUCH APPARATUS AND TERMINAL DEVICE

CROSS REFERENCE TO RELATED APPLICATIONS

The present application is a continuation of international application No. PCT/CN2018/092215, filed on Jun. 21, 2018, which is hereby incorporated by reference in its entirety.

TECHNICAL FIELD

Embodiments of the present application relate to the field of detection technologies, and in particular, relate to a capacitance detection circuit, a touch apparatus, and a terminal device.

BACKGROUND

In recent years, with the popularization of smart mobile terminals, the requirements for the performance of capacitive touch screens are increasingly high. Correspondingly, the requirements for detection, especially for self-capacitance detection of the capacitive touch screens are also increasingly high.

In the related art, the architecture performance of self-capacitance is poor. With the development of capacitive touch screens, the self-capacitance of capacitive sensors is increasingly high, from less than 50 pF at the beginning, slowly increasing to 100 pF, to the current mainstream 200 pF, and the self-capacitance of the latest capacitive sensors is up to 500 pF. As the capacitance of capacitive sensors increases, the self-capacitance generated when the capacitive sensors are touched is greatly reduced. For example, a capacitive sensor with a self-capacitance of 50 pF produces a self-capacitance of 1 pF when touched, while a capacitive sensor with a self-capacitance of 500 pF produces a self-capacitance of 0.2 pF when touched. Thus, the capacitance change signal generated by the capacitive sensor with larger self-capacitance when touched is extremely small, and cannot be detected by the existing self-capacitance architecture.

The existing self-capacitance architecture can only support the detection of self-capacitance of 50 pF, and barely support the detection of maximum self-capacitance of about 200 pF. For the capacitive sensor with a self-capacitance of 500 pF, the existing detection circuit fails to support due to the limitation of detection precision.

SUMMARY

In view of the above, one of the technical problems solved by the embodiments of the present application is to provide a capacitance detection circuit, a touch apparatus, and a terminal device for solving the problem that capacitance detection fails when self-capacitance is large in the related art.

Embodiments of the present application provide a capacitance detection circuit, including: a charging circuit, configured to charge a detection capacitor, so that a voltage difference value between two polar plates of the detection capacitor is a first preset voltage value; a discharging circuit, configured to cause the charged detection capacitor to release a first quantity of charges, where the first charge quantity is smaller than a charge quantity corresponding to the first preset voltage value; and a signal detection circuit, configured to detect a voltage difference value between a voltage value on the detection capacitor after being discharged by the discharging circuit and a second preset voltage value to determine a capacitance change of the detection capacitor based on the voltage difference value.

Optionally, the first charge quantity is determined based on the first preset voltage value, the second preset voltage value, and an initial capacitance value of the detection capacitor, the first preset voltage value being greater than the second preset voltage value.

Optionally, the first charge quantity is determined based on a product of the difference between the first preset voltage value and the second preset voltage value and the initial capacitance value.

Optionally, the charging circuit includes a first switch, the discharging circuit includes a second switch, and the signal detection circuit includes a third switch; when the charging circuit charges the detection capacitor, the first switch is switched on, and the second switch and the third switch are switched off; when the discharging circuit discharges the detection capacitor, the second switch is switched on, and the first switch and the third switch are switched off; when the signal detection circuit detects the voltage difference value between the voltage value on the detection capacitor and the second preset voltage value, the third switch is switched on, and the first switch and the second switch are switched off.

Optionally, when the third switch is switched on, if the current sampling capacitance value of the detection capacitor is equal to a set capacitance value, after the detection capacitor is discharged, the corresponding voltage value of the detection capacitor is equal to the second preset voltage value; when the third switch is switched on, if the current sampling capacitance value of the detection capacitor is greater than or smaller than the set capacitance value, after the detection capacitor is discharged, the corresponding voltage value of the detection capacitor is not equal to the second preset voltage value.

Optionally, the set capacitance value is equal to the initial capacitance value of the detection capacitor.

Optionally, the discharging circuit further includes a discharging resistor, a first end of the discharging resistor is connected to the second switch, and a second end of the discharging circuit is grounded; when the second switch is switched on, the detection capacitor is discharged to the ground through the discharging resistor.

Embodiments of the present application further provide a touch apparatus, including a capacitive sensor and the capacitance detection circuit; the capacitance detection circuit is electrically connected to the capacitive sensor, and performs capacitance detection on the capacitive sensor to output a voltage difference value indicating a capacitance detection result, the voltage difference value of the capacitance detection result being used to determine touch information acting on the capacitive sensor.

Optionally, the touch apparatus further includes a switch matrix, and the capacitive sensor is connected to the capacitance detection circuit through the switch matrix.

Optionally, the capacitive sensor includes a plurality of sensor channels; the switch matrix includes a plurality of switch groups, each switch group is correspondingly connected to a capacitance detection circuit, each switch group includes at least two channel control switches, and each channel control switch is correspondingly connected to a sensor channel.

Optionally, the touch apparatus further includes a processing module, and the processing module is connected to the capacitance detection circuit to acquire and process the voltage difference value output by the capacitance detection circuit.

Optionally, the processing module includes: a digital module, configured to convert the voltage difference value into a digital signal; a mixer module, configured to perform voltage amplitude demodulation on the digital signal; a coordinate calculation module, configured to calculate coordinates of a touch position on the capacitive sensor based on the demodulated digital signal; and a coordinate sending module, configured to send the coordinates.

Embodiments of the present application further provide a terminal device, including the touch apparatus.

From the above technical solutions, in the capacitance detection circuit according to the embodiments of the present application, a detection capacitor is charged through a charging circuit, and discharged (e.g., discharged to the ground) through a discharging circuit to release part of charges on the detection capacitor, thereby avoiding the problem that the capacitance change of the detection capacitor cannot be detected by a signal detection circuit that is saturated due to high capacitance of the detection capacitor and many charges stored.

BRIEF DESCRIPTION OF THE DRAWINGS

To describe the technical solutions in the embodiments of the present application or in the related art more clearly, the following briefly introduces the accompanying drawings required for describing the embodiments or the related art. Apparently, the accompanying drawings in the following description show some embodiments of the present application, and persons skilled in the art may still derive other drawings from these accompanying drawings without creative efforts.

DETAILED DESCRIPTION

To make the objectives, features, and advantages of the embodiments of the present application more obvious and understandable, the following clearly and completely describes the technical solutions in the embodiments of the present application with reference to the accompanying drawings in the embodiments of the present application. Apparently, the described embodiments are some but not all of the embodiments of the present application. All other embodiments obtained by persons of ordinary skill in the art based on the embodiments of the present application without creative efforts shall fall within the protection scope of the embodiments of the present application.

Specific implementations of the present application are further described hereinafter with reference to drawings of the embodiments of the present application.

Figure 1:
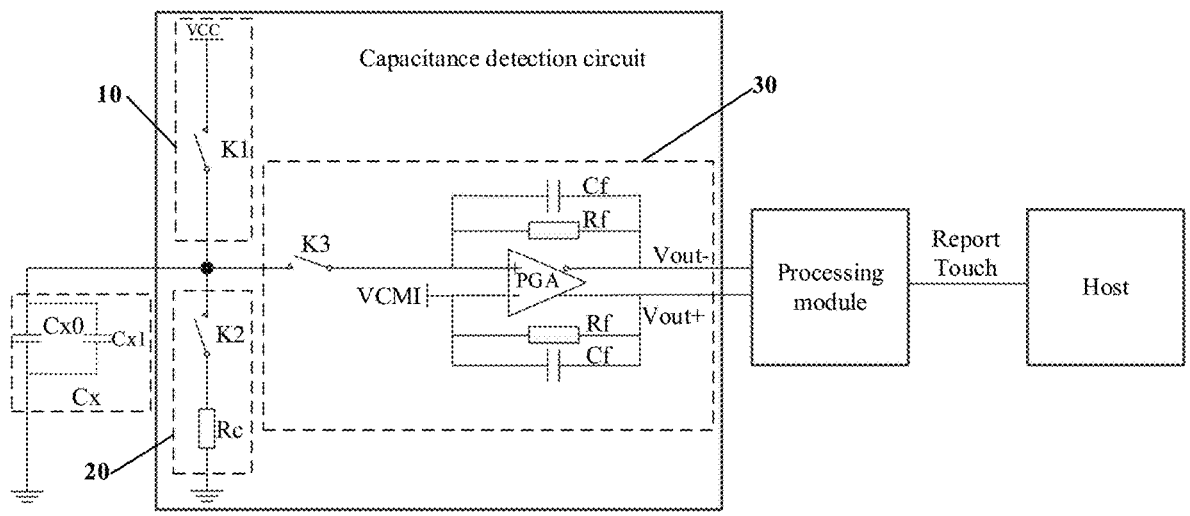
FIG. 1 is a schematic structural diagram of a capacitance detection circuit, a detection capacitor, a processing module, and a host connected according to an embodiment of the present application.

As shown in FIG. 1, a capacitance detection circuit includes a charging circuit 10, a discharging circuit 20, and a signal detection circuit 30. The charging circuit 10 is configured to charge a detection capacitor Cx, so that a voltage difference value between two polar plates of the detection capacitor Cx is a first preset voltage value; the discharging circuit 20 is configured to cause the charged detection capacitor Cx to release a first quantity of charges, where the first charge quantity is smaller than a charge quantity corresponding to the first preset voltage value; and the signal detection circuit 30 is configured to detect a voltage difference value between a voltage value on the detection capacitor Cx after being discharged by the discharging circuit 20 and a second preset voltage value to determine a capacitance change of the detection capacitor Cx based on the voltage difference value.

In the capacitance detection circuit, a detection capacitor Cx is charged through a charging circuit 10, and discharged (e.g., discharged to the ground) through a discharging circuit 20 to release part of charges on the detection capacitor Cx, thereby avoiding the problem that the capacitance change of the detection capacitor Cx cannot be detected by a signal detection circuit 30 that is saturated due to high capacitance of the detection capacitor Cx and many charges stored.

Referring to FIG. 1, taking the detection on self-capacitance of a capacitive sensor by a PGA circuit (Programmable Gain Amplifier circuit) as an example, the detection principle of the capacitance detection circuit is described below:

For a capacitive sensor with a large self-capacitance, especially for a capacitive sensor with a self-capacitance of 500 pF, because of its large self-capacitance, it stores a lot of charges. When the capacitive sensor is detected by a PGA circuit, the stored charges are directly released to the PGA circuit to saturate the PGA circuit, causing detection distortion and incorrect detection of capacitance changes on the capacitive sensor. In order to prevent the PGA circuit from saturating, an amplification factor of the PGA circuit needs to be decreased, which causes signals output by the PGA circuit to be weak and to fail in acquisition by a back-end module, so that capacitance changes on the capacitive sensor cannot be correctly detected.

In order to obtain a usable signal capable of determining a capacitance change of the capacitive sensor in the case where the PGA circuit is not saturated, the capacitance detection circuit according to the present embodiment includes a discharging circuit 20, and after a detection capacitor (a self-capacitor of the capacitive sensor) is charged by the charging circuit 10, a discharging circuit 20 is used to release part of charges from the detection capacitor Cx to reduce the total amount of charges on the detection capacitor Cx, so that the PGA circuit is not saturated when the detection capacitor Cx is detected via the PGA circuit, the amplification factor of the PGA circuit can be increased, and the signal output by the PGA circuit can be acquired and processed by the back-end module.

In addition, because part of charges are released, the total quantity of charges on the detection capacitor Cx is reduced, and if the self-capacitance of the capacitive sensor that is touched increases (the capacitance of the detection capacitor Cx changes from Cx0 to Cx0+Cx1), the proportion of charges corresponding to the increased capacitance (Cx1) in the total quantity of charges increases, so that the signal intensity increases, and the capacitance change of the detection capacitor Cx is more easily detected.

The capacitance detection circuit in the present embodiment is specifically described below with reference to FIG. 1:

Regarding a charging circuit 10, as shown in FIG. 1, the charging circuit 10 includes a first power supply (referred to as VCC) and a first switch K1, a first end of the first switch K1 is connected to the first power supply, and a second end of the first switch K1 is connected to a detection capacitor Cx to charge the detection capacitor Cx by the first power supply VCC.

Specifically, in the present embodiment, the first power supply VCC charges the detection capacitor Cx, so that a voltage difference value between two polar plates of the detection capacitor Cx is a first preset voltage value. It should be noted that the first preset voltage value may be set to any appropriate voltage value based on different detection needs, which is not limited in the present embodiment. For example, the first preset voltage value is a voltage value of the first power supply VCC, or the first preset voltage value is 5V, 2V, etc.

Regarding a discharging circuit 20, in the present embodiment, the discharging circuit 20 includes a second switch K2 and a discharging resistor Rc. The second switch K2 and the discharging resistor Rc are connected in series. The discharging circuit 20 is configured to discharge the detection capacitor Cx, thereby reducing the total quantity of charges on the detection capacitor Cx, avoiding saturation of a signal detection circuit 30 due to too many charges on the detection capacitor Cx when the signal detection circuit 30 detects the detection capacitor Cx, and ensuring that the capacitance detection circuit can be used to detect the detection capacitor Cx with large self-capacitance.

Specifically, in the present embodiment, the discharging circuit 20 causes the detection capacitor Cx to release a first quantity of charges, where the first charge quantity may be determined as needed, as long as the first charge quantity is smaller than or equal to a charge quantity (a total charge quantity) corresponding to the detection capacitor charged to the first preset voltage value.

Preferably, the first charge quantity is smaller than the total charge quantity. For example, the first charge quantity is determined based on the first preset voltage value, a second preset voltage value, and an initial capacitance value (Cx0) of the detection capacitor Cx. In the present embodiment, for convenience of detection, the first preset voltage value is greater than the second preset voltage value.

Specifically, the first charge quantity (Qc) is determined based on a product of the difference between the first preset voltage value (the first preset voltage value is assumed to be equal to a voltage value of the first power supply, and the first preset voltage value is denoted by VCC) and the second preset voltage value (VCMI) and the initial capacitance value (Cx0). That is, Qc=(VCC−VCMI)*Cx0.

Of course, the present embodiment only exemplifies a preferred determination method for the first charge quantity. In other embodiments, the first charge quantity may be determined by other methods, e.g., manually set or determined by analyzing experimental data, or determined by simulation experiment results, etc.

Regarding a signal detection circuit 30, in the present embodiment, the signal detection circuit 30 includes a third switch K3, a programmable gain amplifier (PGA), and a feedback circuit. The PGA has a first input end, a second input end, a first output end, and a second output end. The first input end is connected to the detection capacitor Cx through the third switch K3. The second input end is connected to a second power supply (VCMI, the second preset voltage value is assumed to be a voltage value of the second power supply). The first output end and the second output end are used to output voltage signals to characterize a voltage difference value between the voltage on the detection capacitor Cx after being discharged and the second preset voltage value. The feedback circuit includes a feedback resistor Rf and a feedback capacitor Cf, and the feedback circuit can be configured to adjust an amplification factor of the PGA. The feedback circuit may be one or two sets based on the number of output ends of the PGA.

It should be noted that the second preset voltage value may be determined as needed. In the present embodiment, the second preset voltage value is smaller than the first preset voltage value. For example, the second preset voltage value is 1 V, 2 V, etc.

The principle of detection and signal amplification on the detection capacitor Cx by the PGA is:

If the voltage input from the first input end is equal to the voltage input from the second input end, the feedback resistor Rf and the feedback capacitor Cf neither discharge charges nor absorb charges, and the differential output of the PGA is (Vout+)−(Vout−)=0V, so no voltage signal is output.

If the voltage input from the first input end is higher than the voltage input from the second input end, the feedback resistor Rf and the capacitor Cf absorb charges until the voltages of the first input end and the second input end are equal, and Vout outputs a positive voltage.

If the voltage input from the first input end is lower than the voltage input from the second input end, the PGA discharges through the feedback resistor Rf and the feedback capacitor Cf until the voltages of the first input end and the second input end are equal, and Vout outputs a negative voltage.

According to the principle, the process of detecting a self-capacitance change of the detection capacitor Cx by the PGA is as follows:

A set capacitance value is preset as a reference for judging whether the self-capacitance changes. For convenience of detection, the set capacitance value may be an initial capacitance value Cx0 of the detection capacitor (in the present embodiment, the initial capacitance value refers to an initial self-capacitance value).

When it is determined that the self-capacitance value of the detection capacitor Cx is the initial capacitance value (Cx0), a first charge quantity Qc is determined. The process is:

The first switch K1 is controlled to be switched on, the second switch K2 and the third switch K3 are controlled to be switched off, and the first power supply VCC charges the detection capacitor Cx via the charging circuit 10, so that the voltage value on the detection capacitor Cx is a first preset voltage value (here the first preset voltage value is set to the voltage value of the first power supply, denoted as VCC). At this time, the charge quantity (Qx) on the detection capacitor Cx is Qx=VCC*Cx0.

The second switch K2 is controlled to be switched on, the first switch K1 and the third switch K3 are controlled to be switched off, and the detection capacitor Cx is discharged to the ground through an amplifier resistor Rc to release a first charge quantity (Qc), so that the voltage value on the detection capacitor Cx is equal to a second preset voltage value (VCMI). At this time, Qc=(VCC−VCMI)*Cx0.

The detection capacitor Cx is detected by the signal detection circuit 30. The specific detection process is:

When the self-capacitance is unchanged: the third switch K3 is switched on, and the first switch K1 and the second switch K2 are switched off. If the current sampling capacitance value of the detection capacitor Cx is equal to the set capacitance value, after the detection capacitor Cx is discharged, the corresponding voltage value of the detection capacitor Cx is equal to the second preset voltage value, and the signal detection circuit 30 does not output a voltage signal. It indicates that the self-capacitance value of the detection capacitor Cx is unchanged.

When the self-capacitance changes: the third switch K3 is switched on, and the first switch K1 and the second switch K2 are switched off. If the current sampling capacitance value of the detection capacitor Cx is greater than or smaller than the set capacitance value, after the detection capacitor Cx is discharged, the corresponding voltage value of the detection capacitor Cx is not equal to the second preset voltage value, and the signal detection circuit 30 outputs a positive voltage signal or a negative voltage signal. It indicates that the self-capacitance value of the detection capacitor Cx changes.

Figure 2:
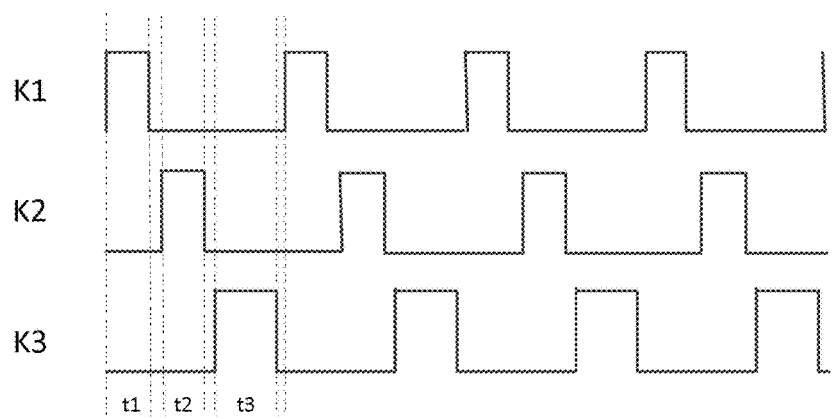
FIG. 2 is a switch control sequence diagram of the capacitance detection circuit according to an embodiment of the present application.

It should be noted that, when the capacitance detection circuit operates, the detection capacitor Cx is controlled to be charged, discharged or detected by controlling on or off of the first switch K1, the second switch K2, and the third switch K3. Specifically, the on or off of the first switch K1, the second switch K2, and the third switch K3 may be controlled by signals in the switch control sequence diagram as shown in FIG. 2. For example, during the time period t1, a control signal of the first switch K1 is at a high level, indicating that the first switch K1 is switched on, and control signals of the second switch K2 and the third switch K3 are at a low level, indicating that the second switch K2 and the third switch K3 are switched off. Similarly, during the time period t2, a control signal of the second switch K2 is at a high level, the second switch K2 is switched on, and the first switch K1 and the third switch K3 are switched off. During the time period t3, a control signal of the third switch K3 is at a high level, the third switch K3 is switched on, and the first switch K1 and the second switch K2 are switched off. This process is repeated periodically to control on and off of the switches.

The capacitance detection circuit for detecting the self-capacitance is capable of supporting the detection of a self-capacitance of 500 pF or a larger self-capacitance. At the same time, the detection for a self-capacitance within 200 pF is significantly improved.

The capacitance detection circuit is applicable to any scenario that requires capacitance detection, is particularly suitable for a scenario having a small capacitance change on a large self-capacitance, and may be used in various fields requiring self-capacitance detection, such as self-capacitance detection in self-capacitance touch and self- and inter-capacitance integrated touch, self-capacitance pressure sensing, and self-capacitance pressure keys.

Figure 3:
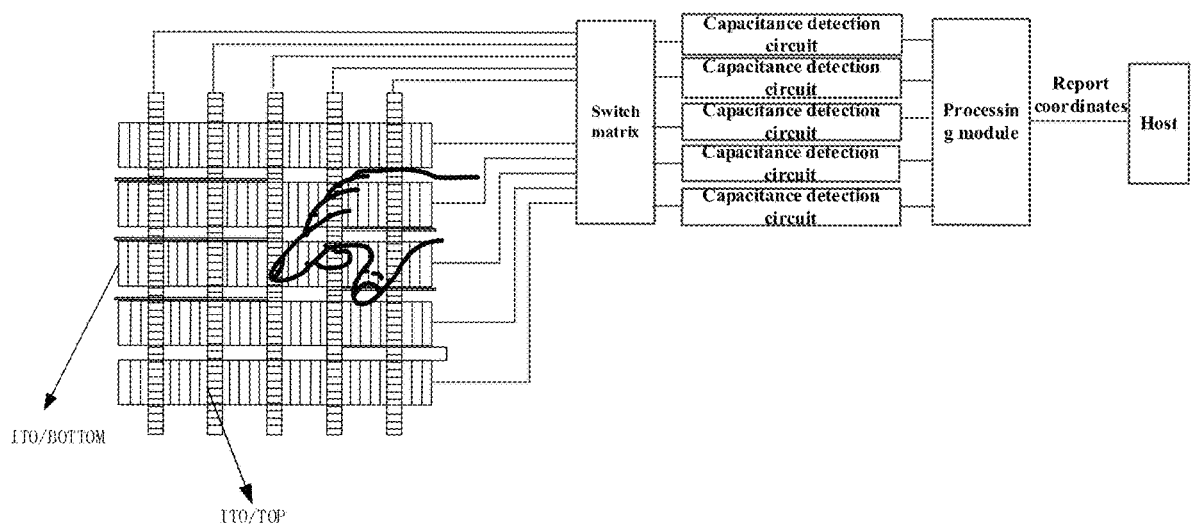
FIG. 3 is a schematic structural diagram of a touch apparatus in which the sensor is a bar pattern capacitive sensor according to an embodiment of the present application.

As shown in FIG. 3, the capacitance detection circuit may be combined with a capacitive sensor to form a touch apparatus for detecting a self-capacitance change of the capacitive sensor, thereby detecting whether the capacitive sensor is touched, and further positioning the touch on the capacitive sensor.

According to another aspect of the present application, a touch apparatus is provided, including a capacitive sensor and the capacitance detection circuit. The capacitance detection circuit is electrically connected to the capacitive sensor, and performs capacitance detection on the capacitive sensor to output a voltage difference value indicating a capacitance detection result, the voltage difference value of the capacitance detection result being used to determine touch information acting on the capacitive sensor.

The principle of detecting, by using the capacitance detection circuit, whether the capacitive sensor is touched is:

When no finger (or other object) touches the capacitive sensor of the touch apparatus (e.g., a touch screen), the self-capacitance (i.e., the to-be-detected capacitance Cx) of the capacitive sensor is an initial capacitance value (Cx0). When a finger touches the capacitive sensor, the self-capacitance increases, and the increased self-capacitance is denoted by Cx1. The capacitance detection circuit is connected to the detection capacitor Cx to detect whether the detection capacitor Cx has a self-capacitance change, thereby determining whether a finger or the like touches the capacitive sensor.

Figure 4:
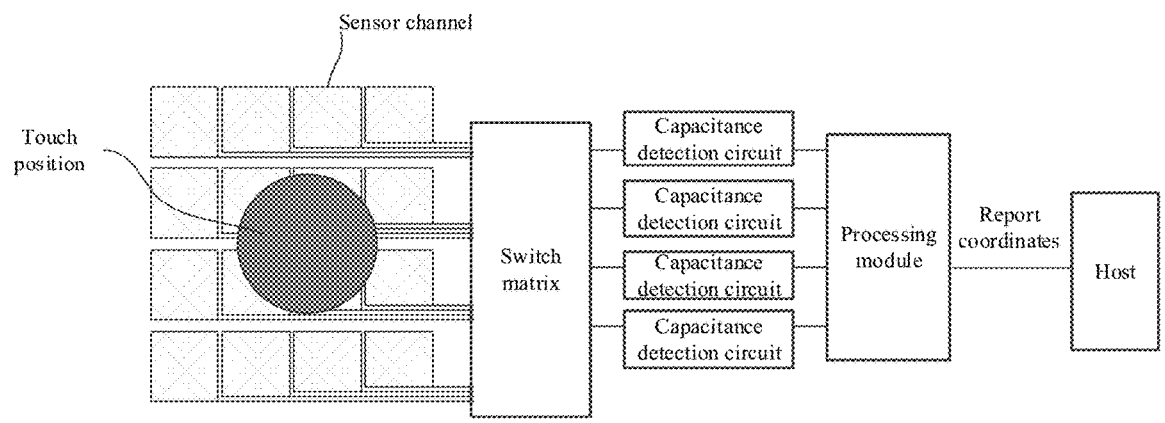
FIG. 4 is a schematic structural diagram of a touch apparatus in which the sensor is a matrix pattern capacitive sensor according to an embodiment of the present application.
Figure 5:
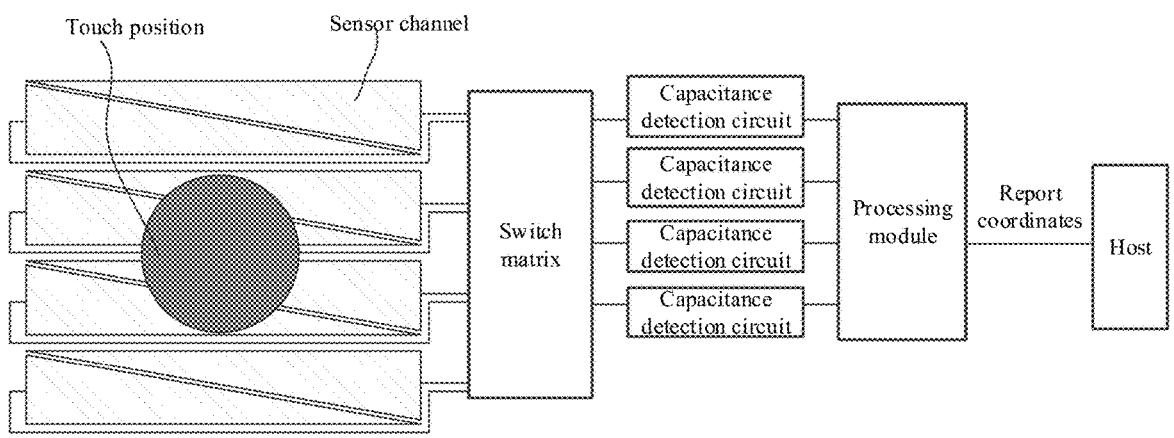
FIG. 5 is a schematic structural diagram of a touch apparatus in which the sensor is a triangular pattern capacitive sensor according to an embodiment of the present application.

As shown in FIGS. 3-5, because the capacitive sensor has a plurality of sensor channels, in order to ensure that the capacitance detection circuit can detect each sensor channel, and the touch position can be further determined when the capacitive sensor is detected to be touched, the control apparatus further includes a switch matrix (SW matrix). The capacitive sensor is connected to the capacitance detection circuit through the switch matrix. The switch matrix can control on and off between the connected capacitive sensor and the capacitance detection circuit, and further control a sensor channel connected to the capacitance detection circuit in the capacitive sensor, so as to determine whether a touch exists and determine the touch position based on whether the detected sensor channel has a capacitance change.

Figure 6:
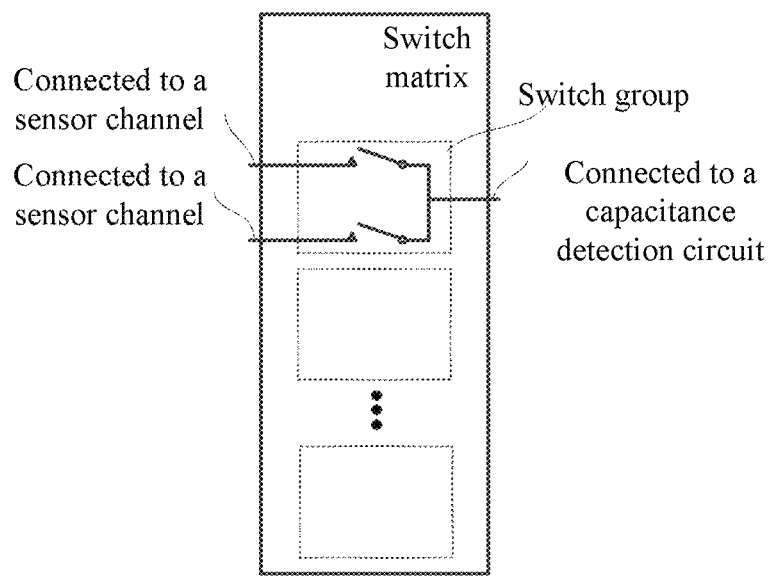
FIG. 6 is a schematic structural diagram of a switch matrix of the touch apparatus according to an embodiment of the present application.
Figure 7:
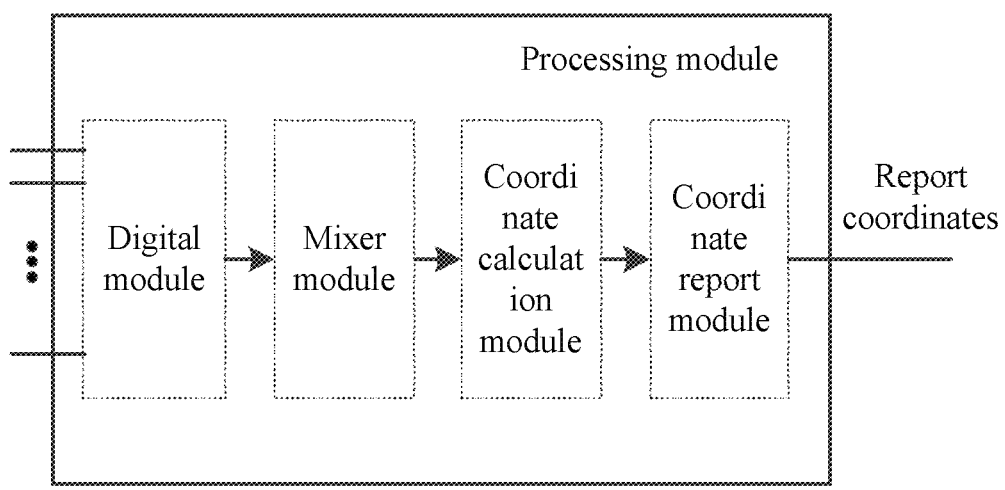
FIG. 7 is a schematic structural diagram of a processing module of the touch apparatus according to an embodiment of the present application.

In order to effectively reduce the space occupied by the capacitance detection circuit and reduce the overall size of the touch apparatus, the switch matrix includes a plurality of switch groups, each switch group is correspondingly connected to a capacitance detection circuit, each switch group includes at least two channel control switches, and each channel control switch is correspondingly connected to a sensor channel. Such connection realizes multiplexing of capacitance detection circuits, and reduces the number of capacitance detection circuits when all the sensor channels can be detected, thereby reducing the overall size of the touch apparatus. In the present embodiment, as shown in FIG. 6, a capacitance detection circuit is multiplexed by two sensor channels. Of course, in other embodiments, a sensor detection circuit may be multiplexed by more sensor channels.

Optionally, the touch apparatus further includes a processing module, and the processing module is connected to the capacitance detection circuit to acquire and process the voltage difference value output by the capacitance detection circuit. The processing module is configured to process a voltage signal output by the capacitance detection circuit to determine whether a touch exists and determine coordinates of the touch position based on the voltage signal.

Specifically, the processing module includes a digital module, a mixer module, a coordinate calculation module, and a coordinate sending module. The digital module is configured to convert the voltage difference value into a digital signal, that is, to digitize the voltage difference value output by the capacitance detection circuit, and is generally an ADC circuit. The mixer module is configured to perform voltage amplitude demodulation on the digital signal. The coordinate calculation module is configured to calculate coordinates of the touch position on the capacitive sensor based on the demodulated digital signal. The coordinate sending module is configured to send the coordinates.

The operating process of detecting, by the capacitance detection circuit, whether the capacitive sensor is touched is described in detail below with reference to FIGS. 2-5:

It should be noted that the capacitance detection circuit may be applied not only to the detection of a DITO Or Sito bar pattern capacitive sensor (as shown in FIG. 3), but also to the detection of a matrix pattern capacitive sensor (as shown in FIG. 4) and a triangular Pattern capacitive sensor (shown in FIG. 5). Of course, the capacitance detection circuit may be applied to the detection of capacitive sensors of other structures.

When no finger touches, the self-capacitance value of the detection capacitor Cx is an initial capacitance value Cx0. During the time period t1, the charging circuit 10 charges the detection capacitor Cx, the first switch K1 is switched on, and the second switch K2 and the third switch K3 are switched off. The first power supply VCC charges the detection capacitor Cx to a first preset voltage value (VCC) via the first switch K1. At this time, the charge quantity (Qx) of the detection capacitor is Qx=Cx0*VCC.

During the time period t2, the discharging circuit 20 discharges the detection capacitor Cx, the second switch K2 is switched on, and the first switch K1 and the third switch K3 are switched off. By adjusting the magnitude of the discharging resistance Rc and the discharging time t2, the voltage value (U0) on the detection capacitor discharged is equal to a second preset voltage value (VCMI), so that in the case of no finger touch, the output voltage difference value is 0 when the signal detection circuit 30 detects the detection capacitor Cx later. Of course, this is only a preferred case. In other embodiments, in the case of no finger touch, the output voltage difference value may be set to any appropriate value when the signal detection circuit 30 detects the detection capacitor Cx later.

At this time, the value of the discharging resistance Rc and the discharging time t2 may be recorded. Accordingly, the first charge quantity Qc=(VCC−VCMI)*Cx0 may also be determined.

During the time period t3, the signal detection circuit 30 detects a voltage difference value between the voltage value on the detection capacitor Cx and the second preset voltage value, the third switch K3 is switched on, and the first switch K1 and the second switch K1 are switched off. When the third switch K3 is switched on, the voltage value on the detection capacitor Cx is denoted by Ux. In the case of no finger touch, the voltage value Ux is equal to the second preset value VCMI, and the voltage difference value output by the signal detection circuit 30 is 0.

In the case of a finger touch, the self-capacitance of the detection capacitor Cx increases by Cx1 and becomes Cx0+Cx1. Then, when the detection capacitor Cx is charged by the charging circuit 10 so that the voltage value thereon is the first preset voltage value VCC, the charge quantity on the detection capacitor Cx is increased relative to the charge quantity in the case of no finger touch. After charges of the first charge quantity Qc are released by the discharging circuit 20, the charge quantity remaining on the detection capacitor Cx is increased relative to the charge quantity in the case of no finger touch, and correspondingly, the voltage value on the detection capacitor Cx discharged is also increased relative to the voltage value in the case of no finger touch, so that when the third switch K3 is switched on and the detection capacitor Cx is detected by the signal detection circuit 30, charges corresponding to the increased capacitance Cx1 in the detection capacitor Cx are partially transferred to the feedback resistor Rf and the feedback capacitor Cf, the quantity of transferred charges being Q=(Vcc−VCMI)*ΔCx. The transferred charges Q flow through the feedback resistor Rf in the form of current, causing the PGA to output the voltage difference value in the form of voltage to form a voltage signal. The increased capacitance Cx1 is directly proportional to the output voltage signal. The processing module may acquire the voltage signal later, and may determine whether an increased capacitance Cx1 exists and determine the magnitude thereof based on the voltage signal change, thereby determining whether a touch operation exists on the capacitive sensor.

Regarding the determination of a touch position, taking a bar pattern capacitive sensor as an example, as shown in FIG. 3, the bar pattern capacitive sensor generally includes a plurality of lateral sensor (e.g., ITO/bottom shown in FIG. 3) channels and a plurality of longitudinal sensor (e.g., ITO/TOP as shown in FIG. 3) channels, where two layers of sensor channels are stacked vertically or interconnected by perforating.

Through the switch matrix, the lateral sensor channels and the longitudinal sensor channels are connected to the capacitance detection circuits to detect the self-capacitance of the channels. The switch matrix may control the sensor channels detected at any moment. If the lateral sensor channels are detected at a moment, the longitudinal sensor channels are detected at next moment. When the voltage signal acquired by the processing module indicates that the self-capacitance of the detected channel changes, finger touch coordinates may be calculated based on the changed channel, and the touch position is then determined. The calculated touch coordinates may be reported to a host.

According to another aspect of the present application, a terminal device is further provided, including the touch apparatus.

The capacitance detection circuit of the touch apparatus in the terminal device charges the self-capacitor, and then the self-capacitor releases part of charges by means of the discharging circuit 20, so that an increase in the self-capacitor is ensured, that is, when the capacitance value of the self-capacitor changes, the increased charges can be transferred by next stage of signal detection circuit 30 (e.g., a PGA circuit) and converted into a voltage signal, the signal detection circuit 30 is not caused to be saturated, the detection on a capacitor having a large self-capacitance value is realized, and the adaptability is improved.

Finally, it should be noted that the above embodiments are merely for describing, rather than limiting, the technical solutions of the embodiments of the present application; although the embodiments of the present application have been described in detail with reference to the foregoing embodiments, those of ordinary skill in the art should appreciate that the technical solutions described in the foregoing embodiments may be modified, or some of the technical features may be equivalently substituted; and such modifications or substitutions do not make the essence of the corresponding technical solutions depart from the spirit and scope of the technical solutions of the embodiments of the present application.

What is claimed is:

1. A capacitance detection circuit, comprising:
   a charging circuit, configured to charge a detection capacitor, so that a voltage difference value between two polar plates of the detection capacitor is a first preset voltage value;
   a discharging circuit, configured to cause the charged detection capacitor to release a first quantity of charges, wherein the first charge quantity is smaller than a charge quantity corre- sponding to the first preset voltage value; and
   a signal detection circuit, configured to detect a voltage difference value between a voltage value on the detection capacitor after being discharged by the discharging circuit and a second preset voltage value to determine a capacitance change of the detection capacitor based on the voltage difference value,
   wherein the charging circuit comprises a first switch, the discharging circuit comprises a second switch, and the signal detection circuit comprises a third switch;
   when the charging circuit charges the detection capacitor, the first switch is switched on, and the second switch and the third switch are switched off;
   when the discharging circuit discharges the detection capacitor, the second switch is switched on, and the first switch and the third switch are switched off; and
   when the signal detection circuit detects the voltage difference value between the voltage value on the detection capacitor and the second preset voltage value, the third switch is switched on, and the first switch and the second switch are switched off.

2. The capacitance detection circuit according to claim 1, wherein the first quantity of charges is determined based on the first preset voltage value, the second preset voltage value, and an initial capacitance value of the detection capacitor when the detection capacitor is not touched by a finger or other object, the first preset voltage value being greater than the second preset voltage value.

3. The capacitance detection circuit according to claim 2, wherein the first quantity of charges is determined based on a product of the difference between the first preset voltage value and the second preset voltage value and the initial capacitance value.

4. The capacitance detection circuit according to claim 1, wherein
   when the third switch is switched on, if the current sampling capacitance value of the detection capacitor is equal to a set capacitance value, after the detection capacitor is discharged, the corresponding voltage value of the detection capacitor is equal to the second preset voltage value; and
   when the third switch is switched on, if the current sampling capacitance value of the detection capacitor is greater than or smaller than the set capacitance value, after the detection capacitor is discharged, the corresponding voltage value of the detection capacitor is not equal to the second preset voltage value.

5. The capacitance detection circuit according to claim 4, wherein the set capacitance value is equal to the initial capacitance value of the detection capacitor.

6. The capacitance detection circuit according to claim 1, wherein the discharging circuit further comprises a discharging resistor, a first end of the discharging resistor is connected to the second switch, and a second end of the discharging circuit is grounded; and when the second switch is switched on, the detection capacitor is discharged to the ground through the discharging resistor.

7. A touch apparatus, comprising a capacitive sensor and the capacitance detection circuit; wherein:
   the capacitance detection circuit is electrically connected to the capacitive sensor, and performs capacitance detection on the capacitive sensor to output a voltage difference value indicating a capacitance detection result, the voltage difference value of the capacitance detection result being used to determine touch information acting on the capacitive sensor; and the capacitance detection circuit comprising:
   a charging circuit, configured to charge a detected capacitor, so that a voltage difference between two polar plates of the detected capacitor is a first preset voltage value;
   a discharging circuit, configured to cause the charged detected capacitor to release a first charge quantity of charges, wherein the first charge quantity is smaller than a charge quantity corresponding to the first preset voltage value; and
   a signal detection circuit, configured to detect a voltage difference value between a voltage value on the detected capacitor after being discharged by the discharging circuit and a second preset voltage value to determine a capacitance change of the detected capacitor based on the voltage difference value,
   wherein the charging circuit comprises a first switch, the discharging circuit comprises a second switch, and the signal detection circuit comprises a third switch;
   when the charging circuit charges the detected capacitor, the first switch is switched on, and the second switch and the third switch are switched off;
   when the discharging circuit discharges the detected capacitor, the second switch is switched on, and the first switch and the third switch are switched off; and
   when the signal detection circuit detects the voltage difference between the voltage value on the detected capacitor and the second preset voltage value, the third switch is switched on, and the first switch and the second switch are switched off.

8. The touch apparatus according to claim 7, wherein the touch apparatus further comprises a switch matrix, and the capacitive sensor is connected to the capacitance detection circuit through the switch matrix.

9. The touch apparatus according to claim 8, wherein the capacitive sensor comprises a plurality of sensor channels; and
   the switch matrix comprises a plurality of switch groups, each switch group is correspondingly connected to a capacitance detection circuit, each switch group comprises at least two channel control switches, and each channel control switch is correspondingly connected to a sensor channel.

10. The touch apparatus according to claim 8, wherein the touch apparatus further comprises a processing module, and the processing module is connected to the capacitance detection circuit to acquire and process the voltage difference value output by the capacitance detection circuit.

11. The touch apparatus according to claim 10, wherein the processing module comprises:
   a digital module, configured to convert the voltage difference value into a digital signal;
   a mixer module, configured to perform voltage amplitude demodulation on the digital signal;
   a coordinate calculation module, configured to calculate coordinates of a touch position on the capacitive sensor based on the demodulated digital signal; and a coordinate sending module, configured to send the coordinates.

12. The touch apparatus according to claim 7, wherein the first quantity of charges is determined based on the first preset voltage value, the second preset voltage value, and an initial capacitance value of the detected capacitor when the detection capacitor is not touched by a finger or other object, the first preset voltage value being greater than the second preset voltage value.

13. The touch apparatus according to claim 12, wherein the first quantity of charges is determined based on a product of the difference between the first preset voltage value and the second preset voltage value and the initial capacitance value.

14. The touch apparatus according to claim 7, wherein
when the third switch is switched on, if the current sampling capacitance value of the detected capacitor is equal to a set capacitance value, after the detected capacitor is discharged, the corresponding voltage value of the detected capacitor is equal to the second preset voltage value; and
when the third switch is switched on, if the current sampling capacitance value of the detected capacitor is greater than or smaller than the set capacitance value, after the detected capacitor is discharged, the corresponding voltage value of the detected capacitor is not equal to the second preset voltage value.

15. The touch apparatus according to claim 14, wherein the set capacitance value is equal to the initial capacitance value of the detected capacitor.

16. The touch apparatus according to claim 7, wherein the discharging circuit further comprises a discharging resistor, a first end of the discharging resistor is connected to the second switch, and a second end of the discharging circuit is grounded; and
when the second switch is switched on, the detected capacitor is discharged to the ground through the discharging resistor.

17. A terminal device, comprising the touch apparatus, wherein the touch apparatus comprising a capacitive sensor and the capacitance detection circuit; wherein
the capacitance detection circuit is electrically connected to the capacitive sensor, and performs capacitance detection on the capacitive sensor to output a voltage difference value indicating a capacitance detection result, the voltage difference value of the capacitance detection result being used to determine touch information acting on the capacitive sensor; and the capacitance detection circuit, comprising:
a charging circuit, configured to charge a detected capacitor, so that a voltage difference between two polar plates of the detected capacitor is a first preset voltage value;
a discharging circuit, configured to cause the charged detected capacitor to release a first charge quantity of charges, wherein the first charge quantity is smaller than a charge quantity corresponding to the first preset voltage value; and
a signal detection circuit, configured to detect a voltage difference value between a voltage value on the detected capacitor after being discharged by the discharging circuit and a second preset voltage value to determine a capacitance change of the detected capacitor based on the voltage difference value,
wherein the charging circuit comprises a first switch, the discharging circuit comprises a second switch, and the signal detection circuit comprises a third switch;
when the charging circuit charges the detected capacitor, the first switch is switched on, and the second switch and the third switch are switched off;
when the discharging circuit discharges the detected capacitor, the second switch is switched on, and the first switch and the third switch are switched off; and
when the signal detection circuit detects the voltage difference between the voltage value on the detected capacitor and the second preset voltage value, the third switch is switched on, and the first switch and the second switch are switched off.

18. The terminal device according to claim 17, wherein the first quantity of charges is determined based on the first preset voltage value, the second preset voltage value, and an initial capacitance value of the detected capacitor when the detection capacitor is not touched by a finger or other object, the first preset voltage value being greater than the second preset voltage value.

* * * * *